(12) United States Patent
Wang et al.

(10) Patent No.: US 12,315,161 B2
(45) Date of Patent: May 27, 2025

(54) METHOD AND SYSTEM FOR GENERATING A DYNAMIC ADDICTIVE NEURAL CIRCUITS BASED ON WEAKLY SUPERVISED CONTRASTIVE LEARNING

(71) Applicant: SHENZHEN INSTITUTES OF ADVANCED TECHNOLOGY, Shenzhen (CN)

(72) Inventors: Shuqiang Wang, Shenzhen (CN); Changwei Gong, Shenzhen (CN)

(73) Assignee: SHENZHEN INSTITUTES OF ADVANCED TECHNOLOGY, Shenzhen (CN)

( * ) Notice: Subject to any disclaimer, the term of this patent is extended or adjusted under 35 U.S.C. 154(b) by 361 days.

(21) Appl. No.: 18/111,876

(22) Filed: Feb. 20, 2023

(65) Prior Publication Data
US 2023/0215006 A1    Jul. 6, 2023

Related U.S. Application Data

(63) Continuation of application No. PCT/CN2021/143741, filed on Dec. 31, 2021.

(51) Int. Cl.
*G06V 10/62* (2022.01)
*G01R 33/56* (2006.01)
(Continued)

(52) U.S. Cl.
CPC ........ *G06T 7/0014* (2013.01); *G01R 33/5608* (2013.01); *G06N 3/094* (2023.01);
(Continued)

(58) Field of Classification Search
CPC ........ G06T 7/0014; G06T 2207/10088; G06T 2207/20076; G06T 2207/10016;
(Continued)

(56) References Cited

U.S. PATENT DOCUMENTS

2021/0118559 A1* 4/2021 Lefkofsky ............. G16B 20/00
2021/0201119 A1    7/2021 Laszlo et al.

FOREIGN PATENT DOCUMENTS

CN         110889496 A      3/2020
CN         111087522 A      4/2020
(Continued)

*Primary Examiner* — Charlotte M Baker (57) ABSTRACT

A method and a system for generating a dynamic addictive neural circuit based on weakly supervised contrastive learning are disclosed. The method includes: based on a convolutional neural network, reducing a dimensionality of voxels of multiple groups of fMRI to attributes of brain region nodes, and generating multiple groups of dynamic brain connection maps containing time series based on the attributes of the brain region nodes; extracting spatio-temporal features of brain connections in the dynamic brain connection maps; inputting the spatio-temporal features into an abnormal connection detection network, calculating an abnormal probability of brain connections based on contrastive learning, and obtaining the brain connection with a highest abnormal probability at each time point; and generating the dynamic addictive neural circuit based on neuroscientific prior knowledge and the brain connection with the greatest probability of abnormality.

20 Claims, 4 Drawing Sheets

(51) Int. Cl.
  *G06N 3/094* (2023.01)
  *G06T 7/00* (2017.01)
  *G06V 10/44* (2022.01)

(52) U.S. Cl.
  CPC ............ *G06V 10/454* (2022.01); *G06V 10/62* (2022.01); *G06T 2207/10088* (2013.01); *G06T 2207/20076* (2013.01)

(58) Field of Classification Search
  CPC . G06T 2207/20084; G06T 2207/30016; G06T 7/0012; G01R 33/5608; G01R 33/4806; G06N 3/094; G06N 20/00; G06N 3/0442; G06N 3/0464; G06N 3/0475; G06N 3/09; G06N 3/045; G06N 3/047; G06V 10/454; G06V 10/62; G06V 2201/03; G06V 10/82
  USPC ........................................................ 382/131
  See application file for complete search history.

(56) References Cited

FOREIGN PATENT DOCUMENTS

| | | |
|---|---|---|
| CN | 112233086 A | 1/2021 |
| WO | 2021067464 A1 | 4/2021 |

\* cited by examiner

METHOD AND SYSTEM FOR GENERATING A DYNAMIC ADDICTIVE NEURAL CIRCUITS BASED ON WEAKLY SUPERVISED CONTRASTIVE LEARNING

CROSS-REFERENCE TO RELATED APPLICATIONS

This application is a continuation of co-pending International Patent Application Number PCT/CN2021/143741, filed on Dec. 31, 2021, the disclosure of which is incorporated herein by reference in its entirety.

TECHNICAL FIELD

This disclosure relates to the field of artificial intelligence, and more particularly relates to a method and system for generating a dynamic addictive neural circuits based on weakly supervised contrastive learning.

BACKGROUND

The description provided in this section is intended for the mere purpose of providing background information related to the present application but doesn't necessarily constitute prior art.

Addiction is a disorder characterized by compulsive drug-seeking. Take smoking addiction as an example. Nowadays, there are more than 300 million tobacco users in China, and the number of people who die from tobacco-related diseases every year is as high as 1 million. From the perspective of inducing smoking behavior, nicotine addiction is the main inducement of smoking and the main obstacle for smokers to quit smoking. Addiction is also regarded as a chronic relapsing functional brain disease.

Currently, the detection of nicotine addictive neural circuits is to analyze and compute the abnormal neural circuits from fMRI (functional magnetic resonance imaging). However, statistics-based methods may require complex preprocessing operations on image data, resulting in a large amount of redundancy. Furthermore, the fMRI image data has the defect of small volume of samples, which makes the training difficult and the training accuracy low.

SUMMARY

A method for generating a dynamic addictive neural circuit based on weakly supervised contrastive learning provided by the present disclosure adopts the following technical solutions.

There is provided a method for generating a dynamic addictive neural circuit based on weakly supervised contrastive learning, including:

based on a convolutional neural network, reducing a dimensionality of voxels of multiple sets of fMRI images to attributes of brain region nodes, and generating multiple sets of dynamic brain connection maps containing time series based on the attributes of the brain region nodes; where each set of fMRI includes multiple fMRI images taken at a fixed frequency within a preset time period;

extracting spatio-temporal features of brain connections in each of the dynamic brain connection maps;

inputting the spatio-temporal features into an abnormal connection detection network, calculating an abnormal probability of brain connections based on contrastive learning, and obtaining the brain connection with the highest abnormal probability at each time point;

based on neuroscience prior knowledge and the brain connection with the highest abnormal probability at each time point, generating a dynamic addictive neural circuit.

By adopting the above technical solution, based on the group label of each group of samples and a small amount of neuroscience prior knowledge, combined with contrastive learning, a weakly supervised contrastive learning model is formed. By directly inputting fMRI images into the weakly supervised contrastive learning model, redundant and complex preprocessing calculations are eliminated. Furthermore, under the premise of small samples, through contrastive learning, the differences in brain connections between different groups of samples can be obtained, combined with a small amount of neuroscience prior knowledge, the neural circuit mechanism of addiction is revealed, the training difficulty is low, and the training accuracy is high.

In some embodiments, the method may further include the following step prior to the step of extracting the spatio-temporal features of the brain connections in each of the dynamic brain connection maps:

using a standard brain connection map as a real sample, and the dynamic brain connection maps as fakes sample to create adversarial learning, and updating the dynamic brain connection map.

According to the above technical solution, through adversarial learning, a dynamic brain connection map that not only conforms to the spatial position information of the standard brain template but also has the original fMRI voxel spatial information is obtained, which is conducive to improve the training accuracy. Furthermore, the standard spatial brain template as prior knowledge has a small amount of data and low learning difficulty.

In some embodiments, the step of extracting the spatio-temporal features of brain connections in each of the dynamic brain connection maps specifically includes:

using a graph convolutional neural network based on a topological spatial brain connection focus mechanism to extract the spatial features of brain connections in each of the dynamic brain connection maps;

extracting the temporal features of the brain connections in each of the dynamic brain connection maps by using a gated recurrent unit based on a time-series brain connection focus mechanism.

According to the above technical solution, the spatial and temporal features of the dynamic brain connection map are extracted separately, so as to obtain the spatio-temporal features of the brain connections, which fully characterize the properties of the dynamic addictive brain connection.

In some embodiments, the sub-step of extracting the spatial features of the brain connections in each of the dynamic brain connection maps using the graph convolutional neural network based on the topological space brain connection focus mechanism specifically includes:

a query—node attribute vector: $q_{c,i}^{(l)} = W_{c,q}^{(l)} h_{(l)i}^{(t)} + b_{c,q}^{(l)}$;

where c represents an abnormal connection focus block, $W_{c,q}^{(l)}$ is a learnable weight matrix, $b_{c,q}^{(l)}$ is an offset; $h_{(l)i}^{(t)}$ represents a multi-head abnormal connection focus block of an i-th node at al-th layer at time point t, $t \in \{1, 2, \ldots, T\}$, T is a total number of time points, $i \in \{1, 2, \ldots, N\}$, N is a total number of nodes;

a key-node attribute vector: $k_{c,j}^{(l)} = W_{c,k}^{(l)} h_{(l)j}^{(t)} + b_{c,k}^{(l)}$;

where j represents a node, $W_{c,k}^{(l)}$ is a learnable weight matrix, $b_{c,k}^{(l)}$ is an offset;

an additional brain connection feature vector: $e_{c,ij}=W_{c,e}e_{ij}+b_{c,e}$;

where $e_{ij}$ is an edge in the dynamic brain connection map, indicating a brain connection between the i-th node and the j-th node at time point t; $W_{c,e}$ is a learnable weight matrix, $b_{c,e}$ is an offset;

a brain connection focus coefficient:

$$\alpha_{c,ij}^{(l)} = \frac{\langle q_{c,i}^{(l)}, k_{c,j}^{(l)} + e_{c,ij}\rangle}{\sum_{u\in N(i)}\langle q_{c,i}^{(l)}, k_{c,u}^{(l)} + e_{c,iu}\rangle};$$

where $\langle q, k\rangle$ is an exponential dot product function, and $N(i)$ is a value other than i;

a hidden state feature vector of a node at (l+1)-th layer: $h_{(l+1)i}^{(t)}=\|_{c=1}^{C}[\Sigma_j \alpha_{c,ij}(v_{c,j}^{(l)}+e_{c,ij})]$;

$$v_{c,j}^{(l)}=W_{c,v}^{(l)}h_{(l)i}^{(t)}+b_{c,v}^{(l)};$$

where $W_{c,v}^{(l)}$ is a learnable weight matrix and $b_{c,v}^{(l)}$ is an offset.

According to the above-mentioned technical solution, the process of extracting spatial features of brain connections by the graph convolutional neural network using topological space brain connection focus mechanism is specifically limited, ensuring that the features that fully characterize the spatial attributes of brain connections can be extracted.

In some embodiments, the sub-step of extracting the temporal features of the brain connections in each of the dynamic brain connection maps by using a gated recurrent unit based on a time-series brain connection focus mechanism specifically includes the following.

a long-term hidden state feature vector: Current$^{t+1}$=MACFB(H$^t$);

in a brain connection focus window, an output of the hidden state feature vector of the node: $C_i^{t+1}=[h_i^{t-w},\ldots,h_i^t]$;

where the window size is w−1, and i represents the node;

a time-series brain connection focus coefficient: $e_i^{t+1}=r^T \tan h(Q(C_i^{t+1})^T)$;

where r is a weight vector and Q is a weight matrix;

$$a_i^{t+1}=\text{softmax}(e_i^{t+1});$$

a node short-term hidden state feature vector: short$_i^{t+1}$= $(a_i^{t+1}C_i^{t+1})^T$;

at time point t+1, a hidden state feature vector set: H$^{t+1}$=GRU(Current$^{t+1}$, Short$^{t+1}$);

Short$^{t+1}$ represents the set of short-term hidden state feature vectors short$_i^{t+1}$ of all nodes, $i\in\{1, 2, \ldots, N\}$, N is a total number of nodes.

According to the above technical solution, in combination with the gated recurrent unit of the brain connection focus mechanism, short-term and long-term hidden state features are learned, so that the hidden state features of each time-series brain functional connection map include other time-series contextual brain connection hidden states information, so as to learn features that can fully characterize the temporal properties of brain connections.

In some embodiments, H$^{t+1}$=GRU(Current$^{t+1}$, Short$^{t+1}$) is specifically:

a brain connection state change gate: $P^{t+1}=\sigma(U_p\text{Current}^{t+1}+W_p\text{Short}^{t+1}+b_p)$;

where $U_p$ and $W_p$ are learnable weight matrices, and $b_p$ is an offset;

a brain connection state reorganization gate: $R^{t+1}=\sigma(U_R\text{Current}^{t+1}+W_R\text{Short}^{t+1}+b_R)$;

where $U_R$ and $W_R$ are both learnable weight matrices, and $b_R$ is an offset for calculating $R^{t+1}$;

$$\tilde{H}^{t+1}=\tan h(U_H \text{Current}^{t+1}+W_H(R^{t+1}\odot\text{Short}^{t+1}));$$

where $U_H$ and $W_H$ are both learnable weight matrices;

$$H^{t+1}=(1-p^{t+1})\odot\text{Short}^{t+1}+p^{t+1}\odot\tilde{H}^{t+1}.$$

According to the above technical solution, the function for calculating the set of hidden state feature vectors at the next time point is specifically limited, and the brain connection state change gate and recombination gate are clarified, thereby concretizing the calculation process of brain connection temporal features.

In some embodiments, the step of inputting the spatio-temporal features into the abnormal connection detection network, and calculating the probability of abnormal brain connections based on contrastive learning specifically includes the following.

The probability of abnormal brain connection is: $F_{score}=\text{MLP}(H^t)$;

$$f(i, j, \omega) = \omega\cdot\sigma(\beta\cdot(\|a\odot h_i + b\odot h_j\|_2^2 - \mu));$$

where $h_i$ is a hidden state feature vector of the i-th node, $h_j$ is a hidden state feature vector of the j-th node, $\sigma(\bullet)$ is a sigmoid function, a and b are the optimization parameters of an output layer, $\beta$ and $\mu$ are a pair Hyperparameter, $\omega$ represents the weight of the edge in the dynamic brain connection map;

a contrast loss function: $L_S=\min(\max\{0, f(H_S)-\Sigma_{a\in A}f(H_a)+\gamma\})$;

$$L_A=\min(\max\{0,f(H_a)-f(H_{a'})+\gamma\});$$

$$L_{TOTAL}=L_S+\Sigma L_A;$$

where max $\max\{0,\bullet\}$ is a hinge loss, $H_S$ is a spatio-temporal feature of the saline injection group, $H_a$ is a spatio-temporal feature of the nicotine injection groups, where $a\in A$, $a\neq a'$, A is the total number of groups in the nicotine injection groups; $\gamma$ is a hyperparameter.

According to the above-mentioned technical solution, based on the strategy of contrastive learning, the contrastive learning between the normal saline injection group and all the nicotine injection groups is carried out, and the pairwise contrastive learning is carried out on the multiple nicotine injection groups, which can fully analyze the individual differences in the dynamic brain connection maps between different control groups, thus facilitating the discovery of abnormal addiction brain connections.

In some embodiments, the step of generating a dynamic addictive neural circuit based on neuroscience prior knowledge and the brain connection with the highest abnormal probability at each time point specifically includes:

based on neuroscience prior knowledge, correcting and integrating the brain connection with the highest abnormal probability to obtain the addictive neural circuit at each time point, and generating the dynamic addictive neural circuit based on the time series.

According to the above-mentioned technical solution, based on the neuroscience prior knowledge, the brain connection with the highest abnormal probability at each time point is corrected and normalized, thereby ensuring the accuracy of the generated addictive neural circuit.

In a second aspect, the present disclosure provides a system for generating a dynamic addictive neural circuit based on weakly supervised contrastive learning provided by the present disclosure adopts the following technical solutions.

There is provided a system for generating a dynamic addictive neural circuit based on weakly supervised contrastive learning, including:

a dynamic brain connection map generation module used to reduce a dimensionality of the voxels of multiple groups of fMRI images to attributes of brain region nodes based on a convolutional neural network, and generate multiple groups of dynamic brain connection maps containing time series according to the attributes of the brain region nodes; where each group of fMRI includes multiple fMRI images taken at a fixed frequency within a preset time period;

a spatial-temporal feature extraction module used to extract spatio-temporal features of brain connections in each of the dynamic brain connection maps;

a most abnormal brain connection acquisition module used to input the spatio-temporal features into an abnormal connection detection network, calculate an abnormal probability of brain connections based on contrastive learning, and obtain the brain connection with the highest abnormal probability at each time point;

a dynamic addictive neural circuit generation module used to generate the dynamic addictive neural circuit based on neuroscience prior knowledge and the brain connection with the highest abnormal probability at each time point.

In view of the above, the present disclosure includes at least one of the following beneficial technical effects:

According to the group label of each group of samples and a small amount of neuroscience prior knowledge, in combination with contrastive learning, a weakly supervised contrastive learning model is formed. By directly inputting fMRI images into the weakly supervised contrastive learning model, redundant and complex preprocessing calculations are eliminated.

Under the premise of small samples, through contrastive learning, the differences in brain connections between different groups of samples are obtained, and in combination with a small amount of neuroscience prior knowledge, the neural circuit mechanism of addiction is revealed, which is easy to train and has high training accuracy.

Using the contrastive learning strategy, the saline injection group and all nicotine injection groups are used for contrastive learning, and the multiple nicotine injection groups are subjected to pairwise contrastive learning, which can fully analyze the individual differences in the dynamic brain connection maps between different control groups, and facilitate the discovery of addictive abnormal brain connections.

DETAILED DESCRIPTION OF EMBODIMENTS

For a better understanding of the objectives, technical solutions, and advantages of the present disclosure, hereinafter the present disclosure will be described in further detail in connection with the accompanying drawing FIGS. 1-4 and some illustrative embodiments. It should be understood that the specific embodiments described here are merely used to explain the present disclosure, rather than limit the present disclosure.

Figure 1:
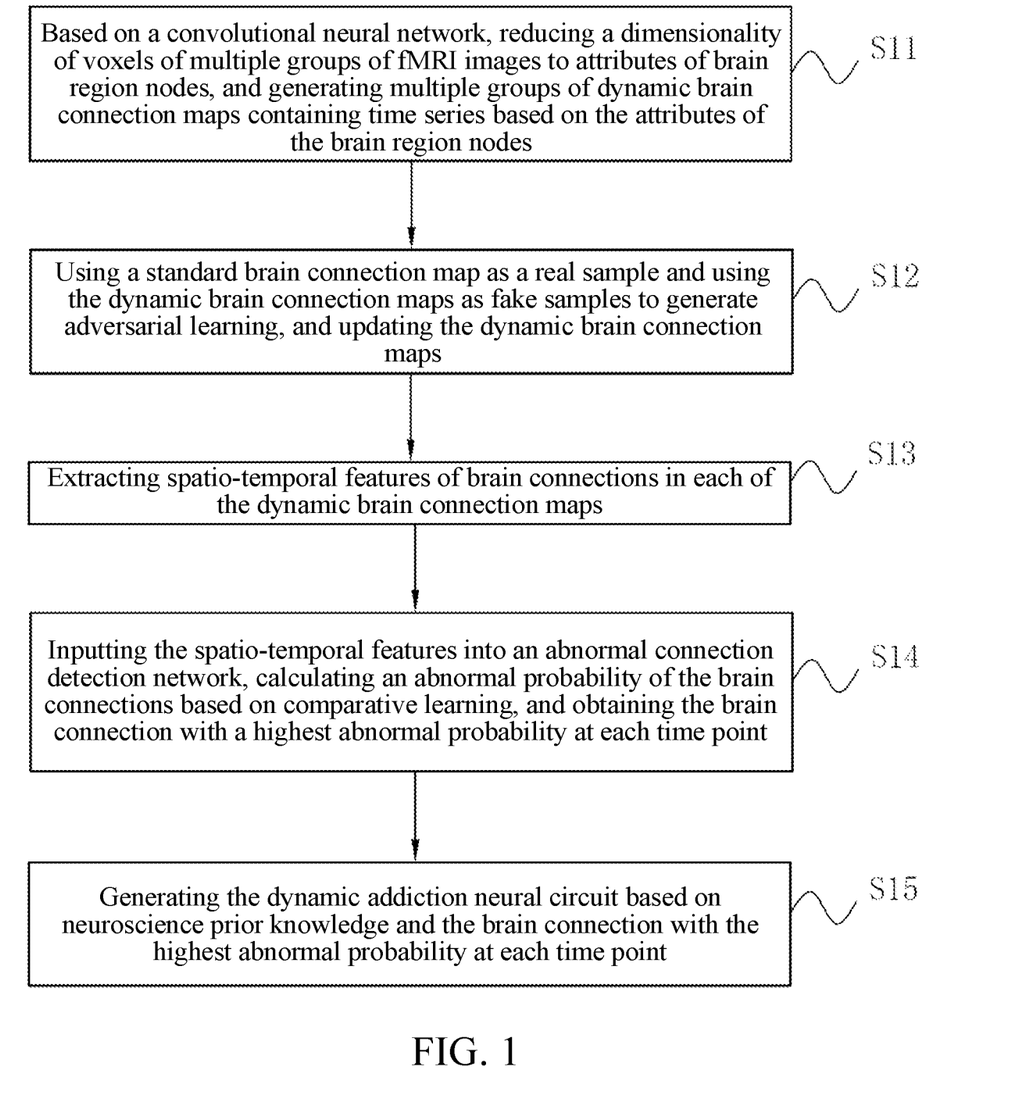
FIG. 1 is a flowchart of a method for generating a dynamic addictive neural circuits based on weakly supervised contrastive learning.

Embodiments of the present disclosure disclose a method for generating a dynamic addictive neural circuit based on weakly supervised contrastive learning. Referring to FIG. 1, a method for generating a dynamic addictive neural circuit based on weakly supervised contrastive learning includes the following steps.

S11: based on a convolutional neural network, voxels of multiple sets of fMRI images are reduced to the attributes of brain region nodes, and multiple sets of dynamic brain connection maps containing time series are generated based on the attributes of the brain region nodes.

That is, fMRI images of rat animal models in a nicotine addiction experiment are used to generate a dynamic addictive neural circuit based on weakly supervised contrastive learning. The multiple groups of fMRI images include fMRI images of rats injected with normal saline and rats injected with nicotine. The number of groups of rats in the normal saline group is 1, and the number of groups of rats in the nicotine injection group can be set depending on actual conditions, e.g., 1-4. Each set of fMRI images includes multiple fMRI images captured at a fixed frequency within a preset time period. The preset time period is the time period during which the rats are injected with normal saline or nicotine, which can be set to two weeks, three weeks, four weeks or other time periods, which are not to be limited herein.

Specifically, rats in the normal saline injection group and rats in the nicotine injection group are used for the experiment. Rats in the nicotine group can be divided into multiple groups depending on different concentrations, or only one group may be set. Rats in each group are continuously injected for a predetermined period of time to simulate nicotine intake and addiction. During the preset time period, the fMRI images of rats in each group are collected at a fixed frequency, and the fMRI images of rats in each group reflected the changes of brain nerves in the time dimension after injection of normal saline or nicotine of corresponding concentrations.

As such, the convolutional neural network is used to reduce the dimensionality of voxels of each group of fMRIs, making it possible to divide the time segments of fMRI at a meaningful time resolution while keeping the time resolution constant, where each segment is used as a time point to generate a dynamic brain connection map, which fully extracts the time-series dynamic information of fMRI.

The dynamic brain connection map G is: $\{G_t\}_{t=1}^{T}=\{(V_t, E_t, X_t)\}_{t=1}^{T}$. Specifically, in the dynamic brain connection map G, fMRI time segments are used as time series, where each time series is regarded as a time point, brain regions are nodes, and brain connections are edges; Brain connection refers to the functional connections between brain regions; T is the total number of time points; $G_t$ is a snapshot of the dynamic brain connection map at time point t; $V_t$ and $E_t$ represent the node set and edge set respectively; The edge $e_{ij} \in E_t$, representing the brain function connection between the i-th node and the j-th node at time point t, and its weight is ω; $X_t = \{x_i^t\}_1^N$ represents the attribute set of the nodes, where N represents the total number of nodes and $x_i^t$ is the attribute vector of the i-th node at time point t. The fMRI images of the normal saline injection group $I_S$ and the nicotine injection group $I_a$ are separately input into the above-mentioned dynamic brain connection map G to obtain the dynamic brain connection maps $G_S$, $G_a$, where a∈{1, 2, ..., A}, A is the total number of nicotine injection groups.

In this step, fMRI images are directly input into the weakly supervised adversarial learning model to obtain a dynamic brain connection map, eliminating redundant and complex preprocessing computations.

S12: using the standard brain connection map as a real sample and the dynamic brain connection maps as fake samples to generate adversarial learning, and updating the dynamic brain connection map.

The standard brain connection map is the brain function connection map preprocessed by the standard spatial brain template containing the prior information of the brain atlas. The standard brain connection map is used as the real sample $G_{True}$, and the dynamic brain connection map obtained in the previous step is used as the fake sample $G_{Fake}$ to generate adversarial learning and update the dynamic brain connection maps.

The formula for generative adversarial learning is:

$$\min \max L(D,G) = E_{G_{True} \sim Pdata(GTrue)}[\log D(G_{True})] + E_{G_{Fake} \sim Pdata(GFake)}[\log(1-D(G(G_{Fake}))]$$

where D is a discriminator representing the standard brain connection map, and G is a generator representing an abnormal brain connection map. In this application, G specifically refers to the dynamic brain connection map. Adversarial learning is generated for the dynamic brain connection maps of three categories, and the dynamic brain connection maps are updated, that is, $G_S$ and $G_a$ are input into the above formulas for update. The updated dynamic brain connection maps are dynamic brain connection maps that approximate the spatial information of the brain atlas, and represent the abnormal brain connection patterns of nicotine addiction under different categories.

It should be noted that step S12 is optional. If step 12 is performed, through adversarial learning, a dynamic brain connection map that not only conforms to the spatial position information of the standard brain template, but also has the original fMRI voxel spatial information is obtained, which improves the training accuracy. Furthermore, the annotated brain functional connection map is obtained by preprocessing the standard spatial brain template containing the prior information of the brain atlas. The standard spatial brain template has a small amount of data and low learning difficulty.

S13: extracting spatio-temporal features of brain connections in each of the dynamic brain connection maps.

Each group of dynamic brain connection maps is input into the neural network for learning, and the spatial and temporal features of brain connections in the dynamic brain connection maps are extracted.

Figure 2:
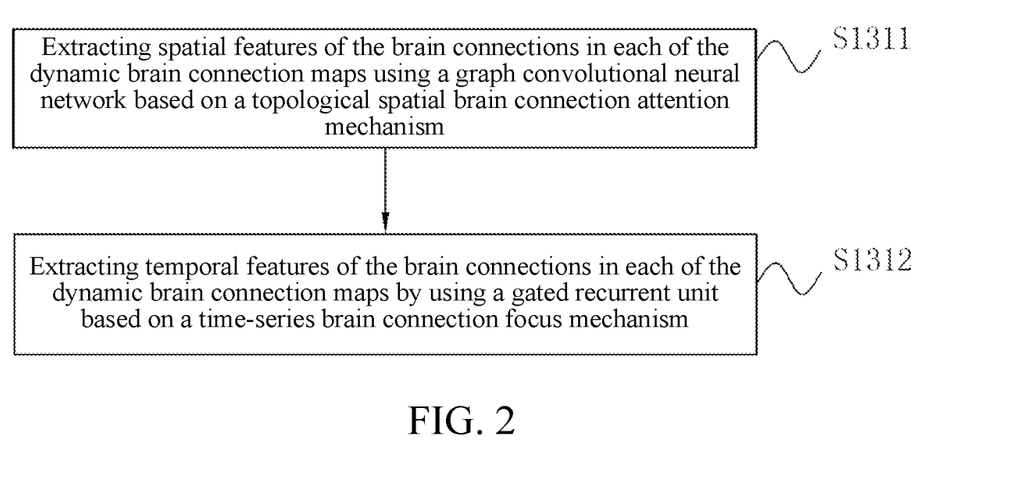
FIG. 2 is a flowchart of a method for extracting spatio-temporal features of brain connections.

Specifically, referring to FIG. 2, step S13 includes the following sub-steps.

S1311: using a graph convolutional neural network based on a topological space brain connection focus mechanism to extract spatial features of brain connections in a dynamic brain connection map.

The graph convolutional neural network based on the topological space brain connection focus mechanism is composed of multi-head anomalous connection focus block (MACFB), which has a powerful graph learning ability and can learn the geometric space features between nodes in the connection network.

Specifically, the number of abnormal connection focus blocks is C, and the value of C may be 2, 3 or 4.

Hidden state feature vector set: $H_{(l)}^{(t)} = \{h_{(l)1}^{(t)}, h_{(l)2}^{(t)}, \ldots, h_{(l)i}^{(t)}, \ldots, h_{(l)N}^{(t)}\}$, where $H_{(l)}^{(t)}$ represents the multi-head abnormal connection focus block of layer l at time point t, t∈{1, 2, ..., T}, T is the total number of time points; i represents a node, i∈{1, 2, ..., N}, N is the total number of nodes. $h_{(l)i}^{(t)}$ represents the multi-head abnormal connection focus block of the i-th node in the l-th layer at time point t.

Query—node attribute vector: $q_{c,i}^{(l)} = W_{c,q}^{(l)} h_{(l)i}^{(t)} + b_{c,q}^{(l)}$;

where i represents a node, c represents an abnormal connection focus block, $W_{c,q}^{(l)}$ is a learnable weight matrix for computing a query-node attribute vector, b % is an offset for calculating of the query-node attribute vector;

Key-node attribute vector: $k_{c,j}^{(l)} = W_{c,k}^{(l)} h_{(l)j}^{(t)} + b_{c,k}^{(l)}$;

where j represents a node, $W_{c,k}^{(l)}$, is a learnable weight matrix for calculating the key-node attribute vector, $b_{c,k}^{(l)}$ is an offset for calculating the key-node attribute vector;

Additional brain connection feature vector: $e_{c,ij} = W_{c,e} e_{ij} + b_{c,e}$;

where $e_{ij}$ represents the brain connection between the i-th node and the j-th node at time point t, and its weight is ω. $W_{c,e}$ is a learnable weight matrix for computing additional brain connection feature vectors, and $b_{c,e}$ is an offset for computing additional brain connection feature vectors.

Brain connection focus coefficient:

$$\alpha_{c,ij}^{(l)} = \frac{\langle q_{c,i}^{(l)}, k_{c,j}^{(l)} + e_{c,ij} \rangle}{\sum_{u \in N(i)} \langle q_{c,i}^{(l)}, k_{c,u}^{(l)} + e_{c,iu} \rangle};$$

where <q, k> is an exponential dot product function, and N(i) is a value other than i.

After calculating the brain connection focus coefficient, the message transmission in the graph is carried out to output the hidden state feature vector of the next layer of nodes;

$$h_{(l+1)i}^{(t)} = \|_{c=1}C[\Sigma_j \alpha_{c,ij}(v_{c,j}^{(l)} + e_{c,ij})];$$

$$v_{c,j}^{(l)} = W_{c,v}^{(l)} h_{(l)i}^{(t)} + b_{c,v}^{(l)};$$

where $W_{c,v}^{(l)}$ is the learnable weight matrix for calculating $v_{c,j}^{(l)}$, $b_{c,v}^{(l)}$ is an offset of calculating $v_{c,j}^{(l)}$.

The set $H_{(l+1)}^{(t)}$ of the hidden state feature vectors $h_{(l+1)i}^{(t)}$ of the next layer of nodes is used as the input of the next layer of multi-head abnormal connection focus blocks, or as the final output of the graph convolutional neural network. If it is used as the final output of the graph convolutional neural network, it represents the extracted spatial features of the abnormal brain connection pattern in the dynamic brain connection map.

S1312: using a gated recurrent unit based on a time-series brain connection focus mechanism to extract temporal features of the dynamic brain connection map.

In conjunction with the gated recurrent unit of the brain connection focus mechanism, short-term and long-term hidden state features are learned, so that the hidden state features of each time-series brain functional connection map include other time-series contextual brain connection hidden state information, thereby learning the temporal features of the dynamic brain connection maps.

In the gated recurrent unit, it is needed to calculate the hidden state eigenvector at the next time t+1 from the hidden state eigenvector at time point t.

Long-term hidden state feature vector set: Current$^{t+1}$=MACFB(H$^t$);

In the initial state, H$^t$ represents the output of the graph convolutional neural network, that is, the extracted spatial features of the abnormal brain connection patterns in the dynamic brain connection map.

The short-term hidden state feature vectors are calculated based on brain connection focus window. In the brain function connection focus window, the output of the node hidden state feature vector: $C_i^{t+1}=[h_i^{t-w}, \ldots, h_i^t]$;

where the window size is w−1, and i represents a node.

Time series brain connection focus coefficient: $e_i^{t+1}=r^T \tan h(Q(C_i^{t+1})^T)$;

where r is the weight vector, Q is the weight matrix;

$$a_i^{t+1}=\text{softmax}(e_i^{t+1});$$

Short-term node hidden state feature vector: short$_i^{t+1}$= $(a_i^{t+1}C_i^{t+1})^T$.

The brain connection hidden state feature vector set at the next time point: H$^{t+1}$=GRU(Current$^{t+1}$, Short$^{t+1}$);

Short$^{t+1}$ represents the set of short-term hidden state feature vectors short$_i^{t+1}$ of all nodes, i∈{1, 2, . . . , N}, N is the total number of nodes.

Further, the specific calculation process of H$^{t+1}$=GRU (Current$^{t+1}$, Short$^{t+1}$) is:

Brain connection state change gate: $P^{t+1}=\sigma(U_p\text{Current}^{t+1}+W_p\text{Short}^{t+1}+b_p)$;

where $U_p$ and $W_p$ are both learnable weight matrices for calculating $P^{t+1}$, and $b_p$ is the offset for calculating $p^{t+1}$.

Brain connection state reorganization gate: $R^{t+1}=\sigma(U_R\text{Current}^{t+1}+W_R\text{Short}^{t+1}+b_R)$;

where $U_R$ and $W_R$ are both learnable weight matrices for calculating $R^{t+1}$, and $b_R$ is the offset for calculating $R^{t+1}$.

$$\tilde{H}^{t+1}=\tan h(U_H\text{Current}^{t+1}+W_H(R^{t+1}\odot\text{Short}^{t+1}));$$

where $U_H$ and $W_H$ are both learnable weight matrices for calculating $\tilde{H}^{t+1}$.

$$H^{t+1}=(1-p^{t+1})\odot\text{Short}^{t+1}+p^{t+1}\odot\tilde{H}^{t+1}.$$

When calculating temporal features, the input is spatial features. Therefore, when using the gated recurrent unit based on the time-series brain connection focus mechanism to extract temporal features, the hidden state feature vector set H$^t$ output at time point t represents the extracted spatio-temporal features of the abnormal brain connection pattern from the dynamic brain connection map.

S14: inputting the spatio-temporal features into the abnormal connection detection network, calculating the abnormal probability of brain connections based on contrastive learning, and obtaining the brain connection with the highest abnormal probability at each time point.

In the anomaly connection detection network, at time point t, the output H$^t$ of the hidden state feature vector set is calculated through the fully connected layer, and the abnormal brain connection probability at time point t is obtained as:

$$F_{score}=MLP(H^t);$$

where the abnormal probability represents the abnormal probability of edge $e_{ij}\in E_t$ at time point t, that is, the abnormal probability of each edge in the dynamic brain connection maps $G_S$ and $G_a$.

$$f(i,j,\omega)=\omega\cdot(\|a\odot h_i+b\odot h_j\|_2^2-\mu));$$

where $h_i$ is the hidden state feature vector of the i-th node, $h_j$ is the hidden state of the j-th node, σ(•) is a sigmoid function, a and b are the optimization parameters of the output layer, β and μ are a pair of hyperparameters, co represents the weight of the edge $e_{ij}$ in the dynamic brain connection map; the spatio-temporal features of each group of dynamic brain connection maps are input into the above function f(•) to obtain f(H$_S$) and f(H$_a$).

Using the strategy of contrastive learning, the contrastive loss function of abnormal brain connection learning is defined as:

$$L_S=\min(\max\{0,f(H_S)-\Sigma_{a=1}^A f(H_a)+\gamma\});$$

$$L_A=\min(\max\{0,f(H_a)-f(H_a')+\gamma\});$$

$$L_{TOTAL}=L_S+\Sigma L_A;$$

where max max{0,•} is the hinge loss, H$_S$ is the spatio-temporal feature of the saline injection group, H$_a$ is the spatio-temporal feature of the nicotine injection group, where a∈A, a'∈A, a≠a', A is the total number of the nicotine injection groups; γ is a hyperparameter.

Using the above-mentioned contrastive learning strategy, the saline injection group and all nicotine injection groups are used for contrastive learning, and the multiple nicotine injection groups are subjected to pairwise contrastive learning, which can fully analyze the individual differences in the dynamic brain connection maps between different control groups, and facilitate the discovery of addictive abnormal brain connections.

After the abnormal probability of the brain connection in each dynamic brain connection map is calculated by contrastive learning, the brain connection with the highest abnormal probability is obtained from multiple groups of dynamic brain connection maps at each time point.

As an implementation, before obtaining the brain connection with the highest abnormal probability at each time point, the abnormal probability of the brain connection is input to a preset classifier for iterative training until the classification accuracy converges to the preset accuracy.

Specifically, at time point t, the abnormal probability of each brain connection in each group of dynamic brain connection maps is input to a preset classifier for iterative training. The preset classifier can be selected according to actual needs, and the following classifiers may be able to realize the above functions, such as SVM, KNN, Naive Bayesian, decision tree, logistic regression, neural network algorithm, etc., which are not specifically limited herein. The preset accuracy is set according to actual requirements, and is not limited herein.

S15: generating a dynamic addictive neural circuit based on neuroscience prior knowledge and the brain connection with the highest abnormal probability at each time point.

In combination with the neuroscience prior knowledge, for each time point t, the brain functional connection with the highest abnormal probability is corrected and integrated to obtain the addictive neural circuit at each time point, and then according to the entire time series, a dynamic addictive neural circuit is generated. Correcting the brain connection with the highest abnormal probability at each time point refers to deleting the wrong brain connection and/or adjusting the brain connection with a large deviation based on the neuroscience prior knowledge. The integration of the most abnormal brain functional connection refers to the integration of the corrected brain function into a complete addictive neural circuit for each time point.

In this embodiment, based on the group label of each group of samples and a small amount of neuroscience prior knowledge, combined with contrastive learning, a weakly supervised contrastive learning model is formed, and the training difficulty is low. Furthermore, fMRI images are directly input into the weakly supervised contrastive learning model, eliminating redundant and complex preprocessing calculations. Furthermore, under the premise of small samples, through contrastive learning, the differences in brain connections between different groups of samples are obtained, and in combination with a small amount of neuroscience prior knowledge, the neural circuit mechanism of addiction is revealed, which is easy to train and has high training accuracy.

Figure 3:
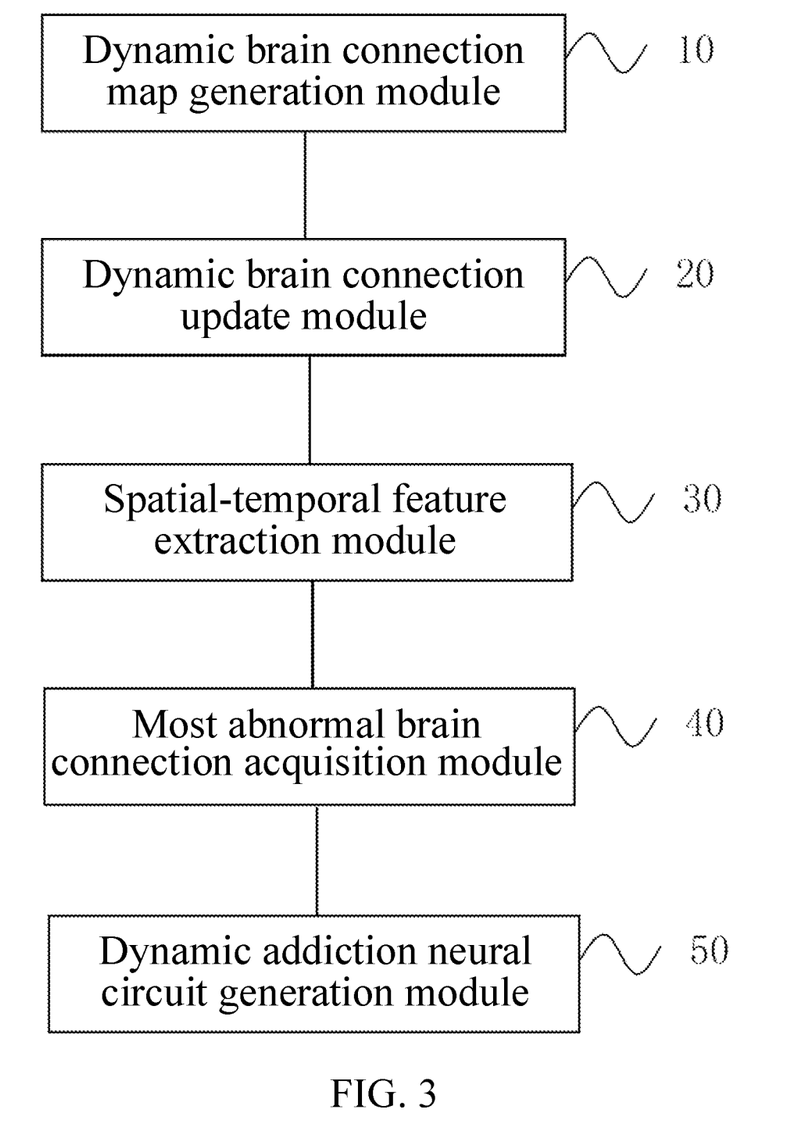
FIG. 3 is a block diagram of a system for generating a dynamic addictive neural circuit based on weakly supervised contrastive learning.

Embodiments of the disclosure further disclose a system for generating a dynamic addictive neural circuit based on weakly supervised contrastive learning. Referring to FIG. 3, the system for generating a dynamic addictive neural circuit based on weakly supervised contrastive learning includes:

a dynamic brain connection map generation module 10 used to reduce the voxels of multiple groups of fMRI images to the attributes of brain region nodes based on a convolutional neural network, and generate multiple groups of dynamic brain connection maps containing time series according to the attributes of the brain region nodes; where each group of fMRI includes multiple fMRI images taken at a fixed frequency within a preset time period;

a dynamic brain connection update module 20 used to use a standard brain connection map as a real sample and the dynamic brain connection maps as fake samples to generate adversary learning and update the dynamic brain connection maps;

a spatial-temporal feature extraction module 30 used to extract the spatio-temporal features of brain connections in each of the dynamic brain connection maps;

a most abnormal brain connection acquisition module 40 used to input the spatio-temporal features into the abnormal connection detection network, calculate the abnormal probability of brain connections based on contrastive learning, and obtain the brain connection with the highest abnormal probability at each time point;

a dynamic addictive neural circuit generation module 50 used to generate a dynamic addictive neural circuit based on neuroscience prior knowledge and the brain connection with the highest abnormal probability at each time point.

The dynamic brain connection update module 20 is optional.

Figure 4:
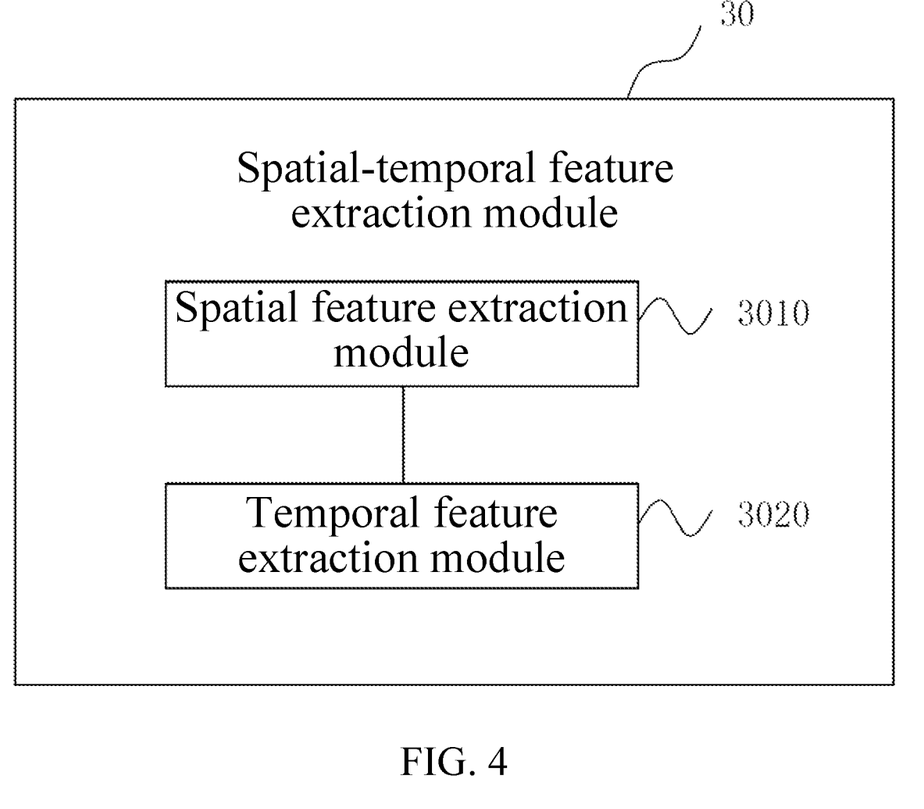
FIG. 4 is a block diagram of a spatio-temporal feature extraction module.

With reference to FIG. 4, the spatio-temporal feature extraction module 30 specifically includes:

a spatial feature extraction module 3010 used to extract the spatial features of the brain connection in the dynamic brain connection map by using a graph convolutional neural network based on the topological space brain connection focus mechanism; and a temporal feature extraction module 3020 used for extracting the temporal features of the dynamic brain connection map by using a gated recurrent unit based on the time-series brain connection focus mechanism.

The system embodiments described above can be used to implement the above method embodiments, and the principles and technical effects thereof are similar, and will not be repeated here.

All of the above are merely some illustrative embodiments of the present disclosure, and are not intended to limit the scope of protection of the present disclosure. Any feature disclosed in this specification (including abstracts and drawings), unless specifically stated, may be replaced by other equivalent or alternative features serving a similar purpose. That is, unless expressly stated otherwise, each feature is merely one example of a series of equivalent or similar features.

What is claimed is:

1. A method for generating a dynamic addictive neural circuit based on weakly supervised contrastive learning, comprising:

based on a convolutional neural network, reducing a dimensionality of voxels of a plurality of groups of fMRI images to attributes of brain region nodes, and generating a plurality of groups of dynamic brain connection maps containing time series based on the attributes of the brain region nodes; wherein each group of fMRI images comprises a plurality of fMRI images taken at a fixed frequency within a preset time period;

extracting spatio-temporal features of brain connections in each of the dynamic brain connection maps;

inputting the spatio-temporal features into an abnormal connection detection network, calculating an abnormal probability of each of brain connections based on contrastive learning, and obtaining the brain connection with a highest abnormal probability at each time point; and generating the dynamic addictive neural circuit based on neuroscience prior knowledge and the brain connection with the highest abnormal probability at each time point.

2. The method as recited in claim 1, further comprising the following step prior to the step of extracting spatio-temporal features of brain connections in each of the dynamic brain connection maps:

using a standard brain connection map as a real sample and using the dynamic brain connection maps as fake samples to create adversarial learning, and updating the dynamic brain connection maps.

3. The method as recited in claim 1, wherein the step of extracting spatio-temporal features of brain connections in each of the dynamic brain connection maps comprises:

extracting spatial features of the brain connections in each of the dynamic brain connection maps by using a graph convolutional neural network based on a topological spatial brain connection focus mechanism; and extracting temporal features of the brain connections in each of the dynamic brain connection maps by using a gated recurrent unit based on a time-series brain connection focus mechanism.

4. The method as recited in claim 3, wherein the sub-step of extracting spatial features of the brain connections in each of the dynamic brain connection maps by using the graph convolutional neural network based on a topological space brain connection focus mechanism comprises:

a query-node attribute vector: $q_{c,i}^{(l)}=W_{c,q}^{(l)}h_{(l)i}^{(t)}+b_{c,q}^{(l)}$; wherein c represents an abnormal connection focus block; $W_{c,q}^{(l)}$ represents a learnable weight matrix, $b_{c,q}^{(l)}$ represents an offset; $h_{(l)i}^{(t)}$ represents a multi-head abnormal connection focus block of an i-th node at al-th layer at time point t, t∈{1, 2, . . . , T}, wherein T represents a total number of time points; i∈{1, 2, . . . , N}, wherein N represented a total number of nodes;

a key-node attribute vector: $k_{c,j}^{(l)}=W_{c,k}^{(l)}h_{(l)j}^{(t)}+b_{c,k}^{(l)}$; wherein j represents a node, $W_{c,k}^{(l)}$ represents a learnable weight matrix, and $b_{c,k}^{(l)}$ represents an offset;

an additional brain connection feature vector: $e_{c,ji} = W_{c,e}e_{ij} + b_{c,e}$ wherein $e_{ij}$ represents an edge in the dynamic brain connection map, indicating a brain connection between the the i-th node and the j-th node at time point t; $W_{c,e}$ represents a learnable weight matrix, and $b_{c,e}$ represents an offset;

a brain connection focus coefficient:

$$\alpha_{c,ij}^{(l)} = \frac{\langle q_{c,i}^{(l)}, k_{c,j}^{(l)} + e_{c,ij} \rangle}{\sum_{u \in N(i)} \langle q_{c,i}^{(l)}, k_{c,u}^{(l)} + e_{c,iu} \rangle};$$

wherein $\langle q, k \rangle$ represents an exponential dot product function, and $N(i)$ represents a value other than i;

a hidden state feature vector of a node at (l+1)-th layer: $h_{(l+1)i}^{(t)} = \|_{c=1}^{C} [\Sigma_j \alpha_{c,ij}(v_{c,j}^{(l)} + e_{c,ij}]$; $v_{c,j}^{(l)} = W_{c,v}^{(l)} h_{(l)i}^{(t)} + b_{c,v}^{(l)}$; wherein $W_{c,v}^{(l)}$ represents a learnable weight matrix, and $b_{c,v}^{(l)}$ represents an offset.

5. The method as recited in claim 3, wherein the sub-step of extracting temporal features of the brain connections in each of the dynamic brain connection maps by using a gated recurrent unit based on a time-series brain connection focus mechanism comprises:

a long-term hidden state feature vector: $\text{Current}^{t+1} = \text{MACFB}(H^t)$;

in a brain connection focus window, an output of a hidden state feature vector of a node: $C_i^{t+1} = [h_i^{t+w}, \ldots, h_i^t]$; wherein a window size is w−1, and i represents a node;

a time-series brain connection focus coefficient: $e_i^{t+1} = r^T \tan h(Q(C_i^{t+1})^T)$; wherein r represents a weight vector and Q represents a weight matrix;

$a_i^{t+1} = \text{softmax}(e_i^{t+1})$;

a short-term hidden state feature vector: $\text{short}_i^{t+1} = (a_i^{t+1} C_i^{t+1})^T$;

at time point t+1, a hidden state feature vector set: $H^{t+1} = \text{GRU}(\text{Current}^{t+1}, \text{Short}^{t+1})$; wherein $\text{Short}^{t+1}$ represents the set of short-term hidden state feature vectors $\text{short}_i^{t+1}$ of all nodes, $i \in \{1, 2, \ldots, N\}$, N represents total number of nodes.

6. The method as recited in claim 5, wherein a computation process of $H^{t+1} = \text{GRU}(\text{Current}^{t+1}, \text{Short}^{t+1})$ is as follows:

a brain connection state change gate: $P^{t+1} = \sigma(U_p \text{Current}^{t+1} + W_p \text{Short}^{t+1} + b_p)$; wherein $U_p$ and $W_p$ are both learnable weight matrices, and $b_p$ is an offset;

a brain connection state reorganization gate: $R^{t+1} = \sigma(U_R \text{Current}^{t+1} + W_R \text{Short}^{t+1} + b_R)$; wherein $U_R$ and $W_R$ are both learnable weight matrices, and $b_R$ is an offset for calculating $R^{t+1}$;

$\tilde{H}^{t+1} = \tan h(U_H \text{Current}^{t+1} + (R^{t+1} \odot \text{Short}^{t+1}))$; wherein $U_H$ and $W_H$ are both learnable weight matrices;

$H^{t+1} = (1 - p^{t+1}) \odot \text{Short}^{t+1} + p^{t+1} \odot \tilde{H}^{t+1}$.

7. The method as recited in claim 3, wherein the step of inputting the spatio-temporal features into an abnormal connection detection network and calculating an abnormal probability of brain connections based on contrastive learning comprises:

a probability of an abnormal brain connection is: $F_{score} = \text{MLP}(H^t)$;

$f(i, j, \omega) = \omega \cdot \sigma(\beta \cdot (\|a \odot h_i + b \odot h_j\|_2^2 - \mu))$; wherein $h_i$ represents a hidden state feature vector of an i-th node, $h_j$ represents a hidden state feature vector of a j-th node, $\sigma(\bullet)$ represents a sigmoid function, a and b represent optimization parameters of an output layer, $\rho$ and $\mu$ represent a pair of hyperparameters, co represents a weight of an edge $e_{ij}$ in each of the dynamic brain connection maps;

a contrast loss function: $L_S = \min(\max\{0, f(H_S) - \Sigma_{a \in A} f(H_a) + \gamma\})$;

$L_A = \min(\max\{0, f(H_a) - f(H_a') + \gamma\})$;

$L_{TOTAL} = L_S + L_A$; wherein $\max\{0, \bullet\}$ represents a hinge loss, $H_S$ represents a spatio-temporal feature of a saline injection group, $H_a$ represents a spatio-temporal feature of a nicotine injection group, wherein $a \in A$, $a' \in A$, $a \neq a'$, and A represents a total number of groups in the nicotine injection groups; $\gamma$ represents a hyperparameter.

8. The method as recited in claim 4, wherein the step of inputting the spatio-temporal features into an abnormal connection detection network and calculating an abnormal probability of brain connections based on contrastive learning comprises:

a probability of an abnormal brain connection is: $F_{score} = \text{MLP}(H^t)$;

$f(i, j, \omega) = \omega \cdot \sigma(\beta \cdot (\|a \odot h_i + b \odot h_j\|_2^2 - \mu))$; wherein $h_i$ represents a hidden state feature vector of an i-th node, $h_j$ represents a hidden state feature vector of a j-th node, $\sigma(\bullet)$ represents a sigmoid function, a and b represent optimization parameters of an output layer, $\beta$ and $\mu$ represent a pair of hyperparameters, co represents a weight of an edge $e_{ij}$ in each of the dynamic brain connection maps;

a contrast loss function: $L_S = \min(\max\{0, f(H_S) - \Sigma_{a \in A} f(H_a) + \gamma\})$;

$L_A = \min(\max\{0, f(H_a) - f(H_a') + \gamma\})$;

$L_{TOTAL} = L_S + \Sigma L_A$; wherein $\max\{0, \bullet\}$ represents a hinge loss, $H_S$ represents a spatio-temporal feature of a saline injection group, $H_a$ represents a spatio-temporal feature of a nicotine injection group, wherein $a \in A$, $a' \in A$, $a \neq a'$, and A represents a total number of groups in the nicotine injection groups; $\gamma$ represents a hyperparameter.

9. The method as recited in claim 5, wherein the step of inputting the spatio-temporal features into an abnormal connection detection network and calculating an abnormal probability of brain connections based on contrastive learning comprises:

a probability of an abnormal brain connection is: $F_{score} = \text{MLP}(H^t)$;

$f(i, j, \omega) = \omega \cdot \sigma(\beta \cdot (\|a \odot h_i + b \odot h_j\|_2^2 - \mu))$; wherein $h_i$ represents a hidden state feature vector of an i-th node, $h_j$ represents a hidden state feature vector of a j-th node, $\sigma(\bullet)$ represents a sigmoid function, a and b represent optimization parameters of an output layer, $\beta$ and $\mu$ represent a pair of hyperparameters, co represents a weight of an edge $e_{ij}$ in each of the dynamic brain connection maps;

a contrast loss function: $L_S = \min(\max\{0, f(H_S) - E_{a \in A} f(H_a) + \gamma\})$;

$L_A = \min(\max\{0, f(H_a) - f(H_a') + \gamma\})$;

$L_{TOTAL} = L_S + L_A$; wherein $\max\{0, \bullet\}$ represents a hinge loss, $H_S$ represents a spatio-temporal feature of a saline injection group, $H_a$ represents a spatio-temporal feature of a nicotine injection group, wherein $a \in A$, $a' \in A$, $a \neq a'$, and A represents a total number of groups in the nicotine injection groups; $\gamma$ represents a hyperparameter.

10. The method as recited in claim 6, wherein the step of inputting the spatio-temporal features into an abnormal connection detection network and calculating an abnormal probability of brain connections based on contrastive learning comprises:
- a probability of an abnormal brain connection is: $F_{score}=MLP(H^r)$;
- $f(i, j, \omega)=\omega \cdot \sigma(\beta \cdot (\|a\odot h_i + b\odot h_j\|_2^2 - \mu))$; wherein $h_i$ represents a hidden state feature vector of an i-th, $h_j$ represents a hidden state feature vector of a j-th node, $\sigma(\cdot)$ represents a sigmoid function, a and b represent optimization parameters of an output layer, p and $\mu$ represent a pair of hyperparameters, $\omega$ represents a weight of an edge $e_{ij}$ in each of the dynamic brain connection maps;
- a contrast loss function: $L_S=\min(\max\{0, f(H_S)-\Sigma_{a\in A}f(H_a)+\gamma\})$;

$L_\Delta=\min(\max\{0, f(H_a)-f(H_a')+\gamma\})$;

$L_{TOTAL}=L_S+L_\Delta$; wherein $\max\{0,\cdot\}$ represents a hinge loss, $H_S$ represents a spatio-temporal feature of a saline injection group, $H_a$ represents a spatio-temporal feature of a nicotine injection group, wherein a∈A, a'∈A, a≠a', and A represents a total number of groups in the nicotine injection groups; $\gamma$ represents a hyperparameter.

11. The method as recited in claim 1, further comprising the following step prior to obtaining the brain connection with a highest abnormal probability at each time point:
inputting the abnormal probability of each of the brain connections into a preset classifier for iterative training until a classification accuracy converges to a preset accuracy.

12. The method as recited in claim 2, further comprising the following step prior to obtaining the brain connection with a highest abnormal probability at each time point:
inputting the abnormal probability of each of the brain connections into a preset classifier for iterative training until a classification accuracy converges to a preset accuracy.

13. The method as recited in claim 3, further comprising the following step prior to obtaining the brain connection with a highest abnormal probability at each time point:
inputting the abnormal probability of each of the brain connections into a preset classifier for iterative training until a classification accuracy converges to a preset accuracy.

14. The method as recited in claim 4, further comprising the following step prior to obtaining the brain connection with a highest abnormal probability at each time point:
inputting the abnormal probability of each of the brain connections into a preset classifier for iterative training until a classification accuracy converges to a preset accuracy.

15. The method as recited in claim 5, further comprising the following step prior to obtaining the brain connection with a highest abnormal probability at each time point:
inputting the abnormal probability of each of the brain connections into a preset classifier for iterative training until a classification accuracy converges to a preset accuracy.

16. The method as recited in claim 6, further comprising the following step prior to obtaining the brain connection with a highest abnormal probability at each time point:
inputting the abnormal probability of each of the brain connections into a preset classifier for iterative training until a classification accuracy converges to a preset accuracy.

17. The method as recited in claim 1, wherein the step of generating the dynamic addictive neural circuit based on neuroscience prior knowledge and the brain connection with the highest abnormal probability at each time point comprises:
referring to the neuroscience prior knowledge, correcting and integrating the brain connection with the highest abnormal probability, obtaining an addictive neural circuit at each time point, and generating the dynamic addictive neural circuit according to the time series.

18. The method as recited in claim 2, wherein the step of generating the dynamic addictive neural circuit based on neuroscience prior knowledge and the brain connection with the highest abnormal probability at each time point comprises:
referring to the neuroscience prior knowledge, correcting and integrating the brain connection with the highest abnormal probability, obtaining an addictive neural circuit at each time point, and generating the dynamic addictive neural circuit according to the time series.

19. The method as recited in claim 3, wherein the step of generating the dynamic addictive neural circuit based on neuroscience prior knowledge and the brain connection with the highest abnormal probability at each time point comprises:
referring to the neuroscience prior knowledge, correcting and integrating the brain connection with the highest abnormal probability, obtaining an addictive neural circuit at each time point, and generating the dynamic addictive neural circuit according to the time series.

20. A system for generating a dynamic addictive neural circuit based on weakly supervised contrastive learning, comprising:
- a dynamic brain connection map generation module, used to reduce voxels of a plurality of groups of fMRI images to attributes of brain region nodes based on a convolutional neural network, and generate a plurality of groups of dynamic brain connection maps containing time series based on the attributes of the brain region nodes; wherein each group of fMRI images comprises a plurality of fMRI images taken at a fixed frequency within a preset time period;
- a spatial-temporal feature extraction module, used to extract spatio-temporal features of brain connections in each of the dynamic brain connection maps;
- a most abnormal brain connection acquisition module, used to input the spatio-temporal features into an abnormal connection detection network, calculate a abnormal probability of brain connections based on contrastive learning, and obtain the brain connection with a highest abnormal probability at each time point; and
- a dynamic addictive neural circuit generation module, used to generate the dynamic addictive neural circuit based on neuroscience prior knowledge and the brain connection with the highest abnormal probability at each time point.

* * * * *